Figure 1:
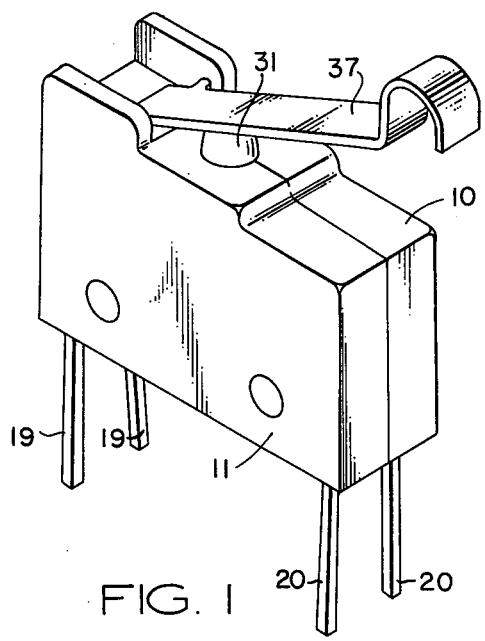

United States Patent [19]
Crouse

[11] 3,949,219
[45] Apr. 6, 1976

[54] OPTICAL MICRO-SWITCH
[75] Inventor: Ronald J. Crouse, Richardson, Tex.
[73] Assignee: Optron, Inc., Carrollton, Tex.
[22] Filed: Jan. 20, 1975
[21] Appl. No.: 542,208

[52] U.S. Cl. .............................. 250/229; 250/239
[51] Int. Cl.² ......................................... G01D 5/34
[58] Field of Search ........ 250/229, 239, 237 R, 234; 200/61.02

[56] References Cited
UNITED STATES PATENTS

| | | | |
|---|---|---|---|
| 3,235,741 | 2/1966 | Plaisance | 250/237 R |
| 3,336,482 | 8/1967 | Mierendorf et al. | 250/229 |
| 3,588,512 | 6/1971 | Hollien | 250/229 X |
| 3,796,880 | 3/1974 | Dorey | 250/229 X |

*Primary Examiner*—Walter Stolwein
*Attorney, Agent, or Firm*—Jack A. Kanz

[57] ABSTRACT

Disclosed is a micro-switch employing a light source and a photo-responsive device disposed in optically interconnected cavities in a common housing. The optical path interconnecting the two cavities is controlled by an opaque reciprocal plunger having a plurality of apertures therethrough which may be placed in register with the optical path by movement of the plunger. The switch may be converted from a normally open to a normally closed switch, or vice versa, by rotation of the plunger to alternately select the aperture in the plunger which may be placed in register with the optical path.

3 Claims, 2 Drawing Figures

U.S. Patent   April 6, 1976   3,949,219

OPTICAL MICRO-SWITCH

This invention relates to switches. More particularly it relates to a miniaturized switch mechanism employing an opaque plunger to selectively interrupt the light path between a photo-emissive device and a photo-responsive device disposed in a common housing.

Miniaturized switches employing a plunger to either make or break electrical contacts in a controlled circuit are used in many electrical and electro-mechanical applications. Conventionally the switch employs a pair of electrical contacts, at least one of which is moveable, mounted in a miniaturized housing with a plunger extending from the housing. The plunger is linked to the moveable contact which is urged in a first direction by a spring to maintain the contacts either open or closed. When the contacts are closed, current flows through leads projecting from the housing when the leads are connected in a suitable circuit. Such miniaturized switches are conventionally referred to as micro-switches and find utility in many electrical and electromechanical applications as limit switches and the like.

Since current must flow through the contacts when the switch is closed, and since the contacts are mechanically closed and opened by the plunger, repeated cycling of the switch inevitably leads to mechanical damage, pitting of the contacts and the like, ultimately causing the switch to fail to operate satisfactorily. Furthermore, since the switch must be mechanically constructed to be normally open or normally closed, substantial rearrangement of the parts is generally required to convert a normally closed switch to a normally open switch and vice versa. Ordinarily the construction of a normally closed switch is substantially different from the construction of a normally open switch. Hence the same parts may not be mechanically substituted to convert a normally open switch to a normally closed switch or vice versa.

In accordance with the present invention a micro-switch is provided in which current flow through the switch is interrupted by interrupting the optical path between a photo-emissive device and a photo-responsive device by an opaque plunger, thus entirely eliminating the current flow through mechanical contacts. Furthermore, the micro-switch of the invention is uniquely constructed to allow conversion of a normally open switch to a normally closed switch by mere rotation of the plunger without otherwise modifying the construction of the device.

Since current flow through the switch is controlled by opening or closing an optical path, the disadvantages of deterioration of mechanical electrical contacts is wholly eliminated. Therefore, the switch may be repeatedly cycled without damage to mechanical parts. Furthermore, since the switch may be converted from normally open to normally closed or vice versa by merely rotating the opaque plunger, a single switch package may be used for either normally open or normally closed switches, thus substantially reducing the cost of production of such switches.

Figure 2:
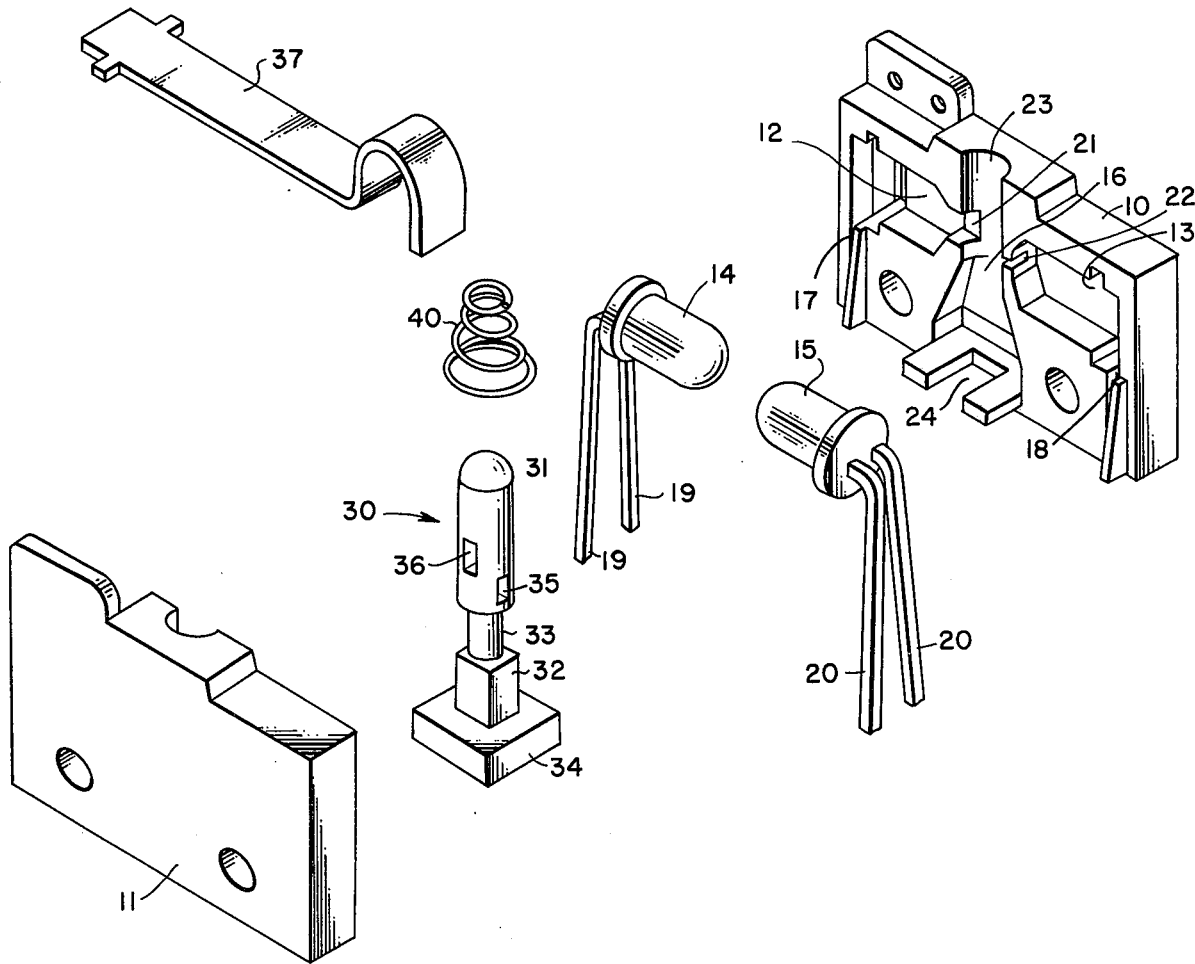

Other advantages and features of the invention will become more readily understood when taken in connection with the appended claims and attached drawings in which:

FIG. 1 is a perspective view of a micro-switch embodying the principles of the invention; and FIG. 2 is an exploded view of the switch of FIG. 1.

In the preferred embodiment, as illustrated in the drawings, the micro-switch is embodied in a housing comprising mating first and second halves 10 and 11 which, when superimposed on each other, define three cavities therein. The first cavity 12 is adapted to enclose a photo-emissive device 14. The housing also defines a second cavity 13 spaced from the first cavity 12. The second cavity 13 is adapted to enclose and mount a photo-responsive device 15.

The housing, composed of the two halves 10 and 11, defines a third cavity 16 intermediate said first and second cavities.

As illustrated in FIG. 2 first cavity 12 and second cavity 13 are wholly enclosed within the housing except for channels 17, 18 through which leads 19 and 20 project.

Cavity 12 is provided with an aperture 21 communicating with the third cavity 16. Likewise, cavity 13 is provided with an aperture 22; also communicating with the third cavity 16. It will be observed that apertures 21 and 22 are aligned approximately centrally with first and second cavities 12 and 13, respectively, thereby providing an optical path from cavity 12 through cavity 16 and into cavity 13.

It will be understood that the housing should be composed of material which is opaque to the optical wavelength emitted by the photo-emissive device 14 and to which the photo-responsive device 15 is responsive. Accordingly, light may escape from the first cavity 12 and enter the second cavity 13 only when apertures 21 and 22 are properly aligned and the optical path therebetween through the third cavity is unobstructed.

The third cavity 16 is preferably in the form of a truncated cone with a cylindrical channel projecting from the apex thereof. As illustrated in FIG. 2 the cylindrical channel 23 extends to the surface of the housing and passes directly between first cavity 12 and second cavity 13. Apertures 21 and 22 provide an optical path across the cylindrical channel 23 allowing light to pass from the first cavity 12 through aperture 21, channel 23, and into second cavity 13 through aperture 22.

A rectangular opening 23 is provided in the base of the conical cavity 16 and coaxially aligned with the cylindrical channel 23. A plunger, generally indicated at 30, is mounted for reciprocal movement in third cavity 16. The plunger 30 generally comprises an upper cylindrical body 31 connected to a lower rectangular body 32 by a shaft 33. The outer dimensions of the upper cylindrical body 31 conform to the inner dimensions of the cylindrical channel 23 so that plunger 30 may be reciprocally moved through channel 23. The outer dimensions of the lower rectangular body 32 substantially conform to the internal dimensions of rectangular opening 24. It will therefore be observed that while the cylindrical portion 32 may be reciprocally moved in channel 23, the rectangular portion 32 prevents plunger 31 from rotation about its axis.

A conical coil spring 40 surrounds shaft 33. The base of coil spring 40 rests on the base of the conical cavity 16 and the apex of the coil 40, surrounding the shaft 33, is lodged beneath the cylindrical portion 31 to urge the plunger 30 in the upward direction.

Plunger 30 is also provided with an end cap 34 which is positioned outside the housing and provides a stop to limit the upward movement of plunger 30. Therefore, when plunger 30 is in the upward position cylindrical portion 31 extends from the top portion a short distance as indicated in FIG. 1.

Cylindrical portion 31 is provided with a pair of channels 35 and 36 passing therethrough normal to the axis of the plunger 30. It will be observed that the lower channel 35 passes through the cylindrical portion 31 at right angles to the upper channel 36 and that the channels are at different elevational planes, the distance between the center lines of channels 35 and 36 being approximately equal to the distance by which plunger 30 extends from the housing when the plunger is in the uppermost position. It will be observed that plunger 30 may be positioned within the housing so that the lower channel 35 is aligned with apertures 21 and 22 when the plunger 30 is in the uppermost position. However, when the plunger is depressed, the lower channel 35 is moved below apertures 21 and 22 and the portion of the cylindrical body 31 above channel 35 effectively blocks both apertures 21 and 22. When arranged in this configuration the switch may be operated as a normally closed switch. That is, when no pressure is applied to the end of the plunger 30, a light path exists between the photo-emissive device 14 and the photo-responsive device 15. In this condition light emitted by the photo-emissive device 14 may pass directly through the plunger into the second cavity 13 and activate the photo-responsive device.

Photo-emissive device 14 may be any suitable light source. The light source 14 is preferably a light-emitting diode which emits photons when forward biased. Therefore, when sufficient voltage is applied across leads 19 photons are emitted by device 14. When apertures 21 and 22 are unobstructed, light from device 14 illuminates the photo-responsive device 15. Photo-responsive device 15 may be any suitable photo-conductive or photo-voltaic device. The circuit to be switched is connected across leads 20. When device 14 is a photo-conductive device, the circuit will be closed when device 14 is sufficiently illuminated to become conductive. Various other photo-responsive devices, such as photo-transistors and the like may, of course, be employed with suitable controlled circuits.

Alternatively, plunger 31 may be rotated 90° about its axis. In this position the portion of the cylindrical body 31 below aperture 36 blocks apertures 21 and 22, preventing the light from passing between first and second cavities when the plunger 30 is in the uppermost position. However, when the plunger is depressed, channel 36 is aligned with apertures 21 and 22, thus providing an optical path between the cavities 12 and 13. In this configuration the switch is said to be normally open.

It will thus be observed that the switch may be changed from a normally open to a normally closed switch by rotating the plunger 30 about its own axis by 90°. In order to provide an apparatus which may be easily converted, the largest outer dimension of shaft 33 interconnecting the cylindrical portion 31 and the rectangular portion 32 should be smaller than the smallest diameter of the rectangular opening 24. Therefore, plunger 30 may be pushed into the top portion of the housing until the shaft portion 33 passes through opening 24. At this point the plunger may be rotated by 90°. The rectangular portion 32 may be reinserted into opening 24 and the switch ready for operation in the alternate form.

It will be observed that in the preferred embodiment illustrated, end cap 34 serves as a stop to limit upward travel of the plunger 30. When the plunger 30 is in the uppermost position, the lower channel 35 lies on the same plane as apertures 21 and 22, and the channel 35 is either aligned with the apertures or the apertures are completely blocked, depending on the rotational position of the plunger.

When the distance by which plunger 30 extends from the housing is equal to the distance between the center lines of channels 35 and 36, the top surface of the housing acts as a stop to limit downward travel of the plunger. Therefore, when the top of the plunger is depressed to the plane of the top surface of the housing, the upper channel 36 lies in the plane of apertures 21 and 22, and the upper channel 36 is either aligned with the apertures or the apertures are completely blocked; again depending on the rotational position of the plunger.

If desired, the switch may be provided with a lever 37 hingedly mounted to activate the plunger 30 as illustrated in FIG. 1.

It will be observed that in the preferred embodiment of the invention as illustrated in FIG. 2, the aperture 21 in the cavity containing the light source is larger than the aperture 22 in the cavity containing the sensor 15. The larger aperture 21 allows more optical energy to escape from the cavity. The aperture 22 is smaller to assist in focusing the light passing therethrough on the active portion of the photo-responsive device 15 and assure sharp turn-on and turn-off characteristics. It should be noted that the plunger need not totally block aperture 21 to open the switch so long as aperture 22 is completely blocked to open the switch.

It will be readily appreciated that the housing may be cast in two halves, as illustrated in FIG. 2, from any suitable material which is opaque to the optical wavelengths to which the photo-responsive device 15 is responsive. Likewise, the plunger 30 may be formed of the same material, thus resulting in an easily manufactured and relatively inexpensive switch housing comprising only three parts. The switch of the invention may be adapted to utilize any conventionally available light source and sensor pair. For example, the light source may be a conventional gallium arsenide diode such as that manufactured by Optron, Inc. of Carrollton, Tx. and designated OP-160. The photo-responsive device must, of course, be responsive to the light emitted by the light source. When the light source is a gallium arsenide device emitting light at approximately 9300 Angstroms, a silicon sensor such as that manufactured by Optron, Inc. of Carrollton, Tx. under the designation OP-500 is particularly suitable. When the above-designated sensor and light source pair is used, the housing and plunger may be conveniently formed of a suitable opaque plastic material.

In the preferred embodiment described, the switch may be operated as a normally open switch or a normally closed switch, the functional arrangement of the switch being determined by the position of the plunger. The switch may be changed from the normally open condition to the normally closed condition or vice versa by rotation of the plunger 30 about its axis 90°. In this embodiment the opening 24 in the base of cavity 16 is preferably square and the rectangular portion of the plunger 30 is likewise square in the horizontal plane. If desired, however, the opening 24 may take other geometric forms so that the plunger may be rotated about its axis sufficiently to align the channels in the cylindrical portion with the apertures 21 and 22 as desired.

Although the invention has been described with particular reference to a two-position switch which is either normally open or normally closed, it will be readily appreciated that the principles thereof are equally applicable to construction of multiple position switches. For example, a switch which is normally open and passes from open to closed to open in one movement of the plunger could be constructed by adding a third channel (not illustrated) above channel 36 aligned parallel with channel 35 and extening the length of the plunger 30. Such a multiple position switch could be converted to a closed-open-closed switch merely by rotation of the plunger as described above.

It is to be understood that although the invention has been described with particular reference to specific embodiments thereof, the forms of the invention shown and described in detail are to be taken as preferred embodiments of same, and that various changes and modifications may be resorted to without departing from the spirit and scope of the invention as defined by the appended claims.

What is claimed is:

1. A switch comprising:
   a. a housing defining first, second and third cavities therein, said first cavity adapted to enclose means for generating photons, said second cavity adapted to enclose means for controlling an electrical circuit when illuminated by said photons, said third cavity extending completely through said housing and located at least partially between said first and second cavities and adapted to mount a reciprocal plunger therein, said housing further defining an optical path from said first cavity to said second cavity through said third cavity;
   b. plunger means mounted for reciprocal movement in said third cavity between a first position and a second position, said plunger means comprising an elongated body having varying cross-sectional dimensions and extending completely through said housing, the first end of said plunger being no larger than the central portion thereof, the central portion of said plunger having first and second optical apertures therethrough, said optical apertures passing transversely to the longitudinal axis of said plunger and at right angles to each other, said first optical aperture aligning with said optical path when said plunger is in said first position and said second optical aperture aligning with said optical path when said plunger is in said second position and rotated 90° about its longitudinal axis, the opposite end of said plunger having an expanded cap which prevents said opposite end from entering said third cavity, the portion of said plunger adjacent said opposite end having rectangular dimensions in cross-section and mating with the opening in said housing adjacent said second end to prevent rotation of said plunger, said plunger further having an intermediate portion between said central portion and said portion having rectangular dimensions in cross-section, the largest cross-sectional dimension of said intermediate portion being less than the smallest cross-sectional dimension of said portion adjacent said end cap, whereby rotation of said plunger is prevented when said plunger is in said first position, said second position, and during transition therebetween, but permitted when said plunger is drawn from said first position past said second position, thereby permitting said switch to be changed from normally open to normally closed and vice versa without disassembling said switch housing, and
   c. resilient means for urging said plunger toward said first position.

2. A switch as defined in claim 1 wherein the first end of said plunger extends from said housing by a distance substantially equal to the distance between the center lines of said first and second optical apertures.

3. A switch as defined in claim 1 wherein the optical path between said first cavity and said third cavity is larger than the optical path between said second cavity and said third cavity.

* * * * *